(12) United States Patent
Leuciuc

(10) Patent No.: US 8,723,599 B1
(45) Date of Patent: May 13, 2014

(54) ADJUSTABLE GAIN AMPLIFIER SYSTEM HAVING CLEANLY ADJUSTABLE AND STABLE LINEARIZED GAIN

(75) Inventor: Adrian Luigi Leuciuc, Frederick, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 101 days.

(21) Appl. No.: 13/462,214

(22) Filed: May 2, 2012

(51) Int. Cl.
 *H03F 3/45* (2006.01)
(52) U.S. Cl.
 CPC .................................... *H03F 3/45* (2013.01)
 USPC ............................ 330/254; 330/253; 327/359
(58) Field of Classification Search
 CPC ......................................................... H03F 3/45
 USPC .................................. 330/253, 254; 327/359
 See application file for complete search history.

(56) References Cited

PUBLICATIONS

Z.Y. Chang, D. Haspelagh, and J. Verfaillie, "A highly linear CMOS Gm-C bandpass filter with on-chip automatic tuning," IEEE JSSC, Mar. 1997, vol. 32, No. 3, pp. 388-397.

S.D. Willingham, K. W. Martin, and A. Ganesan, "A BiCMOS low-distortion 8-MHz low-pass filter", IEEE JSSC, Dec. 1993, vol. 28, No. 12, pp. 1234-1245.

*Primary Examiner* — Robert Pascal
*Assistant Examiner* — Khiem Nguyen
(74) *Attorney, Agent, or Firm* — Rosenberg, Klein & Lee

(57) ABSTRACT

An adjustable gain amplifier system having cleanly adjustable and stable linearized gain is provided for amplifying an input signal. The system generally comprises a main amplifier and a linearized transconductance amplifier coupled thereto, which generates an amplified current signal in response to the input signal according to a variably defined transconductance factor. The linearized transconductance amplifier includes a linearized transconductance portion and a translinear current amplifier portion coupled thereto. The linearized transconductance portion generates an intermediate current signal based upon a voltage of the input signal, and forms an unswitched resistor-based conduction path for that intermediate current signal. The translinear current amplifier portion forms a translinear loop section for amplifying the intermediate current signal to generate the amplified current signal. The translinear current amplifier portion is selectively reconfigurable to correspondingly adjust the transconductance factor, wherein the linearized gain is adjustably defined according to the adjusted transconductance factor.

28 Claims, 13 Drawing Sheets

ADJUSTABLE GAIN AMPLIFIER SYSTEM HAVING CLEANLY ADJUSTABLE AND STABLE LINEARIZED GAIN

BACKGROUND OF THE INVENTION

The subject amplifier system is generally directed to a system for adjustably amplifying a signal in amplitude. More specifically, the subject amplifier system is directed to such a system having a stable linearized gain which may be cleanly adjusted, or without introducing switching noise on the signal being amplified.

Adjustable gain amplifiers are widely used in the art. Examples include programmable gain amplifiers (PGAs) which typically find use in various types of analog front-end (AFE) systems. They are often employed within automatic gain control (AGC) loops to adjust the amplitude of a given signal so that it may suit the requirements of analog or digital processing circuitry further downstream. Control measures within an AGC loop cause the gain of a given PGA to be adjusted as necessary.

Numerous PGA circuit topologies are known, with each conventional topology offering notable advantages but tolerating equally notable drawbacks as a tradeoff. One commonly adopted topology is based on amplifiers whose gains are set by ratios of parameters for passive components having similar type, such as resistors or capacitors. Gain control is effected by selectively switching the passive components. This type of PGA topology is illustrated in FIG. 1, implemented as a four-level gain, amplifier with a gain controlling device formed by banks of switched resistors disposed in the negative feedback of an operational amplifier A (from the inverting output to non-inverting input, and from the non-inverting output to inverting input). The voltage gain of the resulting PGA may be adjusted by appropriately setting the switches $b_0$, $b_1$, $b_2$ to control which of the feedback components $R_{20}$, $R_{21}$, $R_{22}$, $R_{23}$ remain in play and which if any are bypassed. The switch settings thereby control the resistive size of the resulting gain control device (relative to the input resistance element $R_1$) at a particular instant.

Notable advantages of this PGA type include the intrinsic linearity and stability of its voltage gain performance, due mainly to its exclusive reliance upon passive components (resistances in the example shown) to establish the gain. Not only do the passive components engender consistent response to signals at different levels, the gain is established as a ratio of parameters for similar components. Thus, any variations in manufacturing process, supply voltage, and thermal conditions (the so-called PVT variations) which affect these components will largely cancel when the gain is established.

This PGA topology, however, comes with a significant design tradeoff in certain applications. The switching noise due to the operation of switching devices disposed directly in the signal path often proves problematic. In applications like audio systems, for instance, actuating the switches $b_0$, $b_1$, $b_2$ to change the gain of the PGA circuit while processing the input signal leaves undesirable switching noise artifacts in the amplified signal. That is, the signal voltage is disturbed enough at the switching transitions to create audible noise 'glitches' in the output signal.

Another type of PGA known in the art employs an operational transconductance amplifier (OTA) instead of resistors or other switched passive components to control gain. An example of this PGA type is illustrated in FIG. 2, where an input OTA is coupled to an amplifier, such as the operational amplifier A shown with feedback resistances R, which provides the amplified output as a voltage. Generally, an OTA functions much as a voltage controlled current source, producing output current as a function of a difference in input voltages. Such OTA in its simplest form may be implemented as differentially paired transistor devices establishing parallel conductions paths commonly coupled to a current source.

A notable drawback of conventional OTA circuitry is its inherent nonlinearity. Incorporating a conventional OTA in a PGA thus leads to diminished linearity in the PGA's voltage gain. Conventional OTA circuitry also tends to introduce considerable gain instability to the PGA. It leaves the PGA voltage gain defined according to the parameters $G_m$ and R which derive from components of dissimilar type and therefore do not track each other well over process, supply voltage, and temperature variations. Techniques are known in the art to remedy this, and linearize the OTA's prevailing transconductance Gm by making the parameter inversely proportional in value to a reference resistance. Even so, the problem of cleanly adjusting gain remains a challenge in practice.

In the PGA topology of FIG. 2, the PGA voltage gain may be expressed as $A_v = G_m \cdot R$, where $G_m$ is the transconductance of the input OTA. The OTA may be controllable via a ctrl input signal to electronically tune the transconductance $G_m$. Thus, the voltage gain $A_v$ may be controlled by electronically tuning the transconductance $G_m$. Effectively tuning $G_m$ without the use of any switches directly in the signal path, however, is not a trivial matter. Thus, even with the use of such PGAs employing input OTA, the problem of switching noise artifacts plaguing passive component-based PGAs of the type shown in FIG. 1 largely persists.

Another perhaps less apparent drawback of OTA-controlled PGAs is the lack of any suitable measure for maintaining a desired linear range of amplifier output during operation. For example, no suitable measures are employed to establish output linear range in a manner independent of gain variations.

Consequently, neither of the PGA types illustrated in FIGS. 1-2 nor or any other such adjustable gain amplifier known in the art provides for sufficiently reliable combination of switching noise free gain adjustment and linear gain performance that remains stable with PVT variations. Moreover, none of the adjustable gain amplifiers known in the art provides for reliable gain performance in this regard, while maintaining a substantially constant output linear range despite the variably adjusted gain.

There is therefore a need for an adjustable gain amplifier, such as a PGA, which delivers stable linear gain performance over PVT variations, and which may be adjusted in gain without imparting undue switching noise to the amplified signal. There is a further need for such adjustable gain amplifier which preserves a desired output linear range independent of gain variation.

SUMMARY OF THE INVENTION

It is an object of the present invention to provide an adjustable gain amplifier system which delivers stable linear gain performance over PVT variations without undue switching noise in the amplified signal.

It is another object of the present invention to provide in certain, though not necessarily all, embodiments an adjustable gain amplifier system which delivers stable linear gain performance over PVT variations without undue switching noise in the amplified signal, while maintaining a desired output linear range independent of variation in gain.

These and other objects are attained in an adjustable gain amplifier system having cleanly adjustable and stable linearized gain for amplifying an input signal in amplitude. The system generally comprises a main amplifier and a linearized transconductance amplifier coupled thereto, which generates an amplified current signal in response to the input signal according to a variably defined transconductance factor. The linearized transconductance amplifier includes a linearized transconductance portion and a translinear current amplifier portion coupled thereto. The linearized transconductance portion generates an intermediate current signal based upon a voltage of the input signal, and forms an unswitched resistor-based conduction path for that intermediate current signal. The translinear current amplifier portion forms a translinear loop section for amplifying the intermediate current signal to generate the amplified current signal. The translinear current amplifier portion is selectively reconfigurable to correspondingly adjust the transconductance factor, wherein the linearized gain is adjustably defined according to the adjusted transconductance factor.

In certain embodiments, a programmable gain amplifier system is provided having switching noise free gain adjustment and stable linearized gain for amplifying an input signal in amplitude. The system comprises a main amplifier and a linearized transconductance amplifier coupled thereto. The linearized transconductance amplifier operates to generate an amplified current signal in response to the input signal according to a transconductance factor variably defined therefor. The linearized transconductance amplifier includes a linearized transconductance portion and a current amplifier portion synergistically integrated therewith. The linearized transconductance amplifier further includes a variable current source section coupled to at least one of the linearized transconductance and translinear current amplifier portions, that is selectively variable in current source value responsive to an input gain control signal. The linearized transconductance portion generates an intermediate current signal based upon a voltage of the input signal, and includes a reference resistance through which it forms an unswitched resistor-based conduction path for the intermediate current signal. The translinear current amplifier portion is selectively reconfigurable to correspondingly adjust the transconductance factor and includes a translinear loop section for amplifying said intermediate current signal to generate the amplified current signal. The variable current source section is selectively variable in current source value responsive to an input gain control signal. The linearized gain is adjusted according to the adjusted transconductance factor to maintain a constant output linear range, with the transconductance factor remaining inversely proportional in value to the current source and reference resistance values.

In certain other embodiments, a linearized transconductance amplifier system is provided for establishing cleanly adjustable and stable linearized gain in an adjustable gain voltage amplifier. The linearized transconductance amplifier system comprises a linearized transconductance portion and a translinear current amplifier portion synergistically coupled thereto. The linearized transconductance portion generates an intermediate current signal based upon a voltage of the input signal, and includes at least first and second transistor devices, a reference resistance forming an unswitched resistor-based conduction path for the intermediate current signal therethrough, and an input current source section coupled to the reference resistance. The translinear current amplifier portion is selectively reconfigurable to variably establish a transconductance factor with the linearized transconductance portion. The translinear current amplifier portion includes a translinear loop section for amplifying the intermediate current signal to generate the amplified current signal. The translinear current amplifier portion further includes an output current source section coupled to the translinear loop section. The output current source section is fixed in current source value, while the input current source section is selectively variable in current source value responsive to an input gain control signal. The linearized transconductance and translinear current amplifier portions thereby adjustably define the transconductance factor for adjustably controlling the linearized gain and maintaining a constant output linear range for the adjustable gain voltage amplifier. The transconductance factor remains inversely proportional in value to the input current source and reference resistance values.

DESCRIPTION OF THE PREFERRED EMBODIMENTS

Figure 3A:
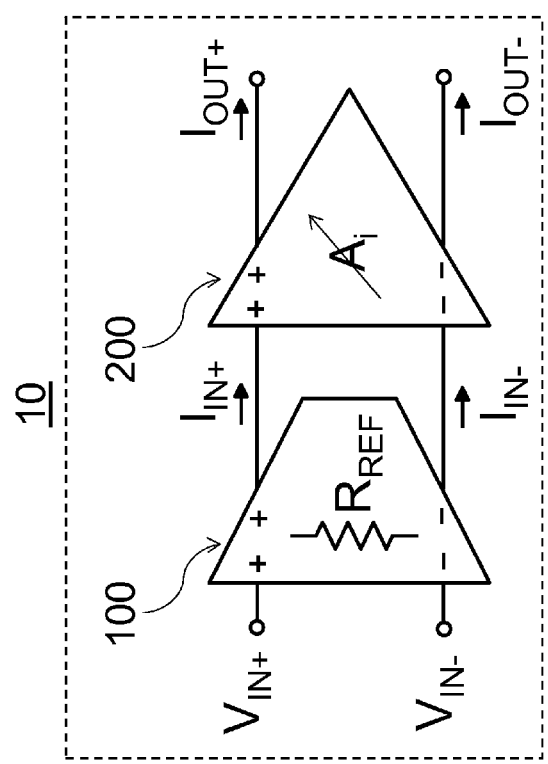
FIG. 3A is a simplified block diagram of a linearized transconductance amplifier formed in accordance with one exemplary embodiment of the present invention, generally illustrating the intecoupling of certain main portions.

Generally, a system formed in accordance with one exemplary embodiment of the present invention provides for adjustable gain amplification of a signal in amplitude, with optimal combination of switching noise-free gain adjustment, linear operation, and stability over variations in fabrication process and operating conditions. As illustrated in the simplified block diagrams of FIGS. 3A and 3C, a linearized transconductance amplifier (LTA) 10 is formed for use in an adjustable gain amplifier system for amplifying signal voltage. The LTA 10 integrates a linearized transconductance portion 100 with a translinear current amplifier portion 200 to synergistic effect. The linearized transconductance portion 100 forms a signal conduction path through a reference resistance, so that a characteristic transconductance parameter $G_m$ is established based on that reference resistance. The translinear current amplifier portion 200 forms a translinear loop for the current signal output of the linearized transconductance portion, whereby current controlled current amplification is effected for variably adjusting the transconductance $G_m$.

Figure 1:
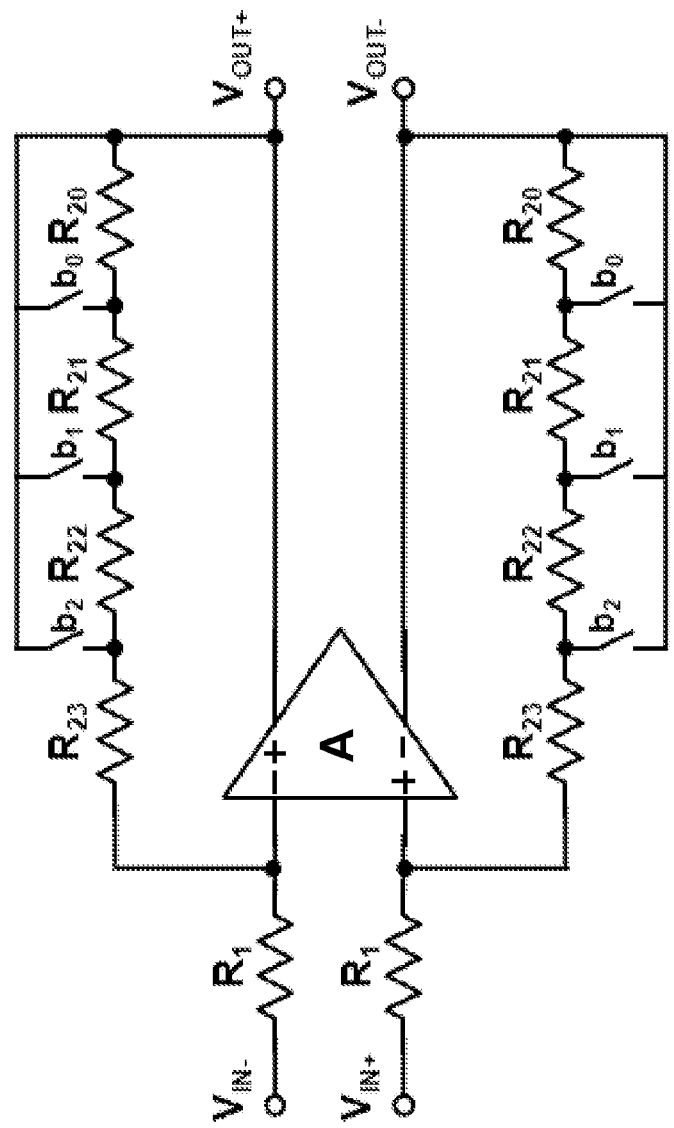
FIG. 1 is a schematic diagram generally illustrating a programmable gain amplifier (PGA) circuit known in the art employing switched-resistance gain control.
Figure 2:
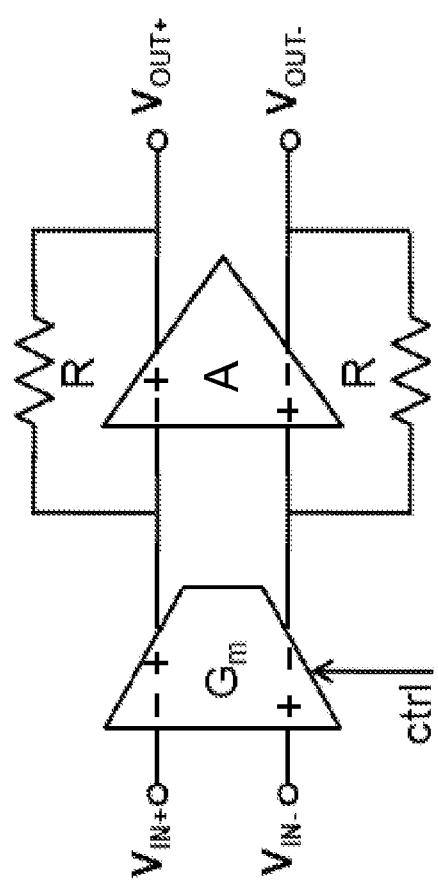
FIG. 2 is a schematic diagram generally illustrating a programmable gain amplifier (PGA) circuit arrangement known in the art employing an externally controlled input operational transconductance amplifier for gain control.

When the LTA 10 is incorporated into an adjustable gain amplifier system, such as in a PGA of the type illustrated in FIG. 2, in place of the conventional input OTA shown there, it provides current input to a main amplifier, such as a suitable transimpedance amplifier, which then provides a voltage output accordingly reflecting the gain. The LTA's transconductance $G_m$ yields a voltage gain in the resulting PGA that is cleanly adjustable and maintains stable, linear operation over PVT variations. In accordance with certain other aspects of the disclosed embodiment, the LTA's transconductance $G_m$ is variably established in proportional relation to the reference resistance of its linearized transconductance portion, as well as to a variable current source value of its translinear current amplifier portion. Preferably, though not necessarily, the LTA transconductance $G_m$ is made variable in inversely proportional relation to both the reference resistance and variable current source values. In alternate embodiments, for example, the LTA transconductance $G_m$ may be variable in inversely proportional relation to the reference resistance value, while remaining non-inversely proportional to a variable current source value.

Among other things, establishing the transconductance $G_m$ in this manner based inversely on the reference resistance ensures that when the LTA 10 is incorporated in a PGA, for instance, the voltage gain $A_v$ (which results from the LTA transconductance and the given operational amplifier's feedback resistance, $A_v = G_m \cdot R$) is necessarily determined according to a ratio of parameters for similar components—namely, resistors. The similar components will exhibit similar responses to PVT variations, the effects of which should mutually cancel. The overall voltage gain $A_v$ is thereby substantially preserved in value notwithstanding PVT variations.

On the other hand, establishing the transconductance $G_m$ based on a variable current source enables the adjustment of $G_m$ through current amplification (in the translinear current amplifier portion). This precludes the use of switching in the signal path while preserving the use of similar devices to adjust gain. Configuring the LTA 10 so that its transconductance $G_m$ value is also inversely dependent upon a variable current source of the translinear current amplifier portion provides the added benefit of preserving constant output linear range for the given adjustable gain amplifier system, as described in following paragraphs.

Figure 3B:
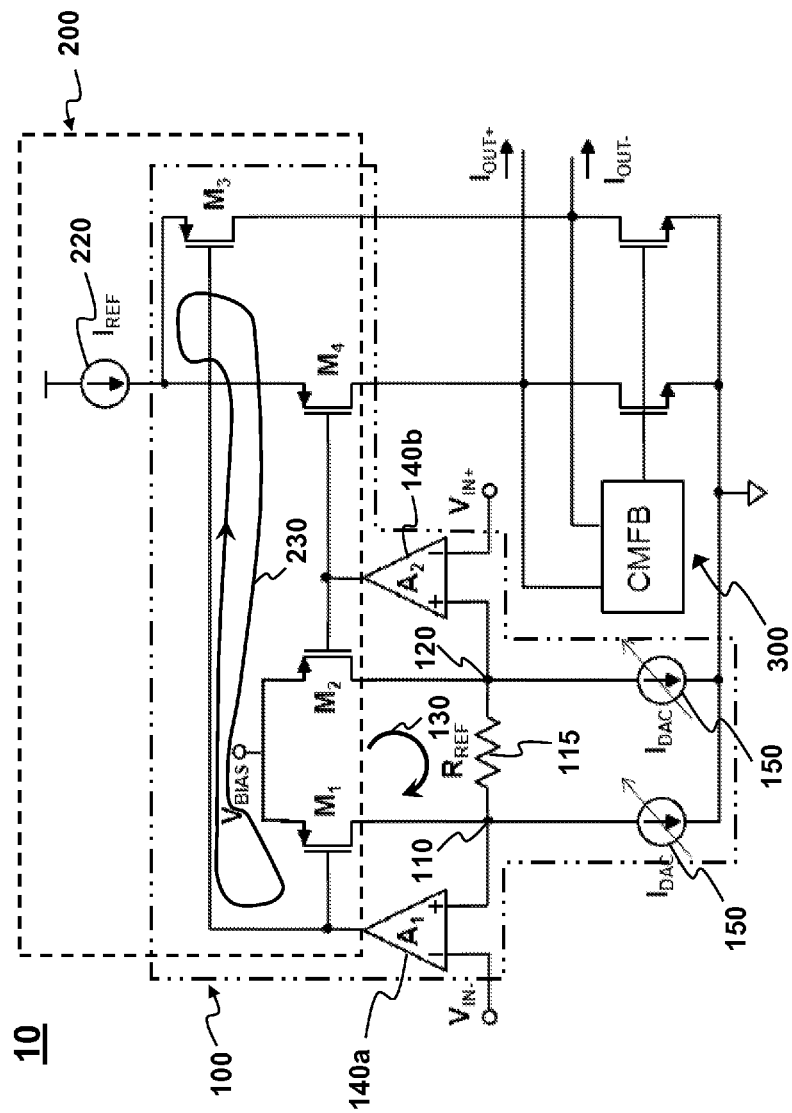
FIG. 3B is a simplified schematic diagram generally illustrating the exemplary embodiment of the linearized transconductance amplifier shown in FIG. 3A.
Figure 3C:
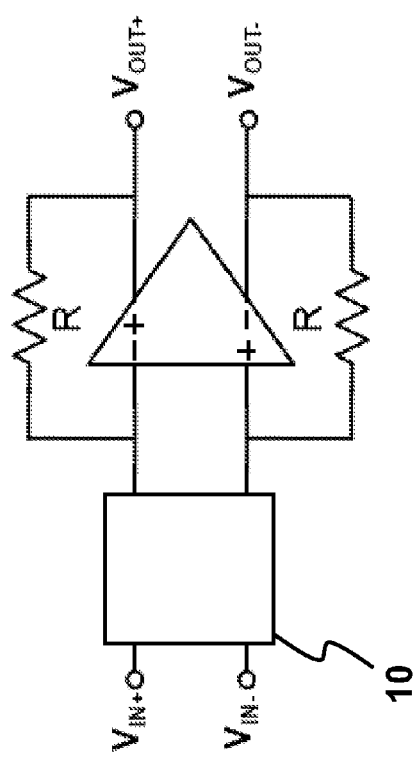
FIG. 3C is a schematic diagram of generally illustrating a PGA circuit arrangement of the type shown in FIG. 2, incorporating the linearized transconductance amplifier embodiment of FIG. 3A in place of a conventional operational transconductance amplifier.

Turning to FIG. 3B, there is shown a schematic diagram illustrating a circuit topology for the LTA 10 formed in accordance with an exemplary embodiment of the present invention. This is but one example of numerous implementations for the subject LTA 10 which may be suitably employed to provide cleanly adjustable and stable linear gain in a PGA like the one shown in FIG. 2, or in any other such adjustable gain amplifier system. As illustrated in FIG. 3B, the linearized transconductance amplifier system 10 receives an input voltage signal ($V_{IN-}$, $V_{IN+}$) and responsively generates an output current signal ($I_{OUT-}$, $I_{OUT+}$) according to its adjustably established transconductance parameter $G_m$. LTA system 10 includes a linearized transconductance portion 100 synergistically integrated with a translinear current amplifier portion 200. The LTA system 10 in this embodiment operates on a differential input signal whose signal variations are carried on complementary signal components having DC levels $V_{IN-}$ and $V_{IN+}$. As such, LTA system 10 preferably includes a common mode feedback amplifier (CFMB) portion 300, which may be of any suitable type known in the art coupled at the output of the current amplifier portion 200.

The linearized transconductance portion 100 in the disclosed example preferably includes one or more reference resistance elements 115 having an effective resistance $R_{REF}$ connected between nodes 110 and 120, to which the non-inverting input terminals of linearizing amplifiers 140a, 140b are respectively connected. Also connected to these nodes 110 and 120 is an input current source section 150, and respective transistor devices $M_1$, $M_2$ whose conduction paths couple to a bias voltage supply $V_{BIAS}$. A third transistor device $M_3$ is connected with its control terminal (gate) tied to both the output terminal of linearizing amplifier 140a and the control terminal (gate) of transistor device $M_1$. Likewise, a fourth transistor device $M_4$ is connected with its control terminal tied to both the output terminal of linearizing amplifier 140b and the control terminal of transistor device $M_2$. The conduction paths defined by the third and further transistor devices $M_3$, $M_4$ (between drain and source) are coupled to an output current source section 220 and respective terminals for the current output signals of LTA system 10.

In this embodiment, each of the transistor devices $M_1$, $M_2$, $M_3$, $M_4$ is preferably of p-channel MOSFET type, configured to operate in its weak inversion region of operation. An exponential relationship is maintained in this region of operation between each device's drain current and gate-source voltage, so long as the prevailing current levels are kept relatively low in view of device size. That is, the transistor devices $M_1$, $M_2$, $M_3$, $M_4$ are each operated at a sufficiently low gate-source voltage compared to its characteristic threshold voltage, with low enough current levels for them to exhibit weak inversion properties.

The input current source section 150 may be formed by any suitable means known in the art to establish a particular branching current for each of the nodes 110, 120. The output current source section 220 (of the translinear current amplifier portion 200) may likewise be formed by any suitable means known in the art to establish a particular current for the conduction paths of each transistor device $M_3$, $M_4$. Preferably, both the input and output current source sections 150 and 220 are implemented by shared circuitry, so as to preserve their consistency in response to any PVT variations.

As described in following paragraphs, one or both of the input and output current source sections 150, 220 may be implemented as variable current sources—selectively variable responsive to an input current control signal, so that the transconductance $G_m$ of LTA system 10 may be accordingly adjusted. Preferably, it is the input current source section 150 that is made so variable, in order to thereby keep the output linear range of the resulting voltage amplification system substantially constant, as also described in following paragraphs.

Each of the linearizing amplifiers 140a, 140b is preferably formed by an operational amplifier configured to approach an ideal amplifier in operation. Thus, very little if any voltage drop is exhibited between the inverting and non-inverting input terminals of each linearizing amplifier 140a, 140b, and the input terminals draw very little if any current.

During operation, when the input component voltage $V_{IN-}$ is applied to an input terminal of linearizing amplifier 140a as shown, it is ideally applied in full to node 110 by the other input terminal of amplifier 140a. The same occurs on the other side, when the input component voltage $V_{IN+}$ is applied to an input terminal of linearizing amplifier 140b as shown. The voltage is ideally applied in full to node 120 by the other input terminal of amplifier 140b. The input voltage differential $V_{IN+}-V_{IN-}$ then falls entirely across the reference resistance element 115.

Since the input terminals of linearizing amplifiers 140a, 140b ideally draw no current, and since the input current source section 150 maintains a constant current flowing in the bottom branches of the nodes 110, 120, a current is necessarily generated as a result through the conduction paths of the first and second transistor devices $M_1$, $M_2$ and, consequently, the reference resistance element 115. The supply voltage $V_{BIAS}$ is suitably maintained in this regard to provide sufficient voltage across the current source section 220 to preserve proper circuit operation—so that, among other things, transistor devices $M_1$, $M_2$, $M_3$, $M_4$ remain 'always on' during circuit operation (preferably in their weak inversion region of operation). An intermediate current is thereby generated as a function of the input voltage differential and the reference resistance value $R_{REF}$, within a switchless resistance-based conduction path 130 formed by the first and second transistor devices $M_1$, $M_2$ and reference resistance element 115. As such, this intermediate current (in path 130) tracks the differential input voltage in inverse relation to the reference resistance value $R_{REF}$, rendering the transconductance $G_m$ which results inversely proportional to $R_{REF}$ as well.

This is similar though not identical in topology to resistor-based operational transconductance amplier circuits which are known in the art. Unlike those known circuit topologies, however, the transconductively generated current is not simply output via a circuit mirror arrangement. In accordance with certain aspects of the disclosed embodiment, the intermediate current generated by the linearized transconductance portion 100 is conveyed to the output (of LTA system 10) via a current amplifying translinear loop effectively formed by the translinear current amplifier portion 200.

The translinear current amplifier portion 200 in the disclosed embodiment is embedded in large part within the linearized transconductance portion 100. This translinear current amplifier portion 200 incorporates the transistor devices $M_1$, $M_2$, $M_3$, $M_4$ of portion 100 operating in weak inversion to define a translinear current amplification loop for the intermediate current generated by portion 100. The translinear current amplifier portion 200 thus serves to control the resulting gain of LTA system 10.

Generally, a translinear loop may be formed using different types of devices. Using bipolar junction transistor (BJT) devices, for example, an even number of such devices may be interconnected to provide even number of PN junctions in the loop, half of the PN junctions disposed in one orientation, the other half being disposed in the opposite orientation. If the current of each PN junction device depends exponentially on the voltage across it, the product of the currents flowing through the PN junction devices having one orientation would equal the product of the currents flowing through the remaining PN junction devices having an opposite orientation.

This concept may be analogously carried over to realize a translinear loop 230 using MOSFET transistor devices, as in the disclosed embodiment. As mentioned, each of the MOSFET transistor devices $M_1$, $M_2$, $M_3$, $M_4$ is made to operate in its weak inversion region. Thus, an exponential relationship is maintained in each device between its drain current ($i_D$) and gate-to-source voltage ($v_{GS}$), in much the manner that the collector current in a BJT device is exponentially related to its base-to-emitter voltage. The devices $M_1$, $M_2$, $M_3$, $M_4$ form the translinear loop 230 as shown.

Figure 4A:
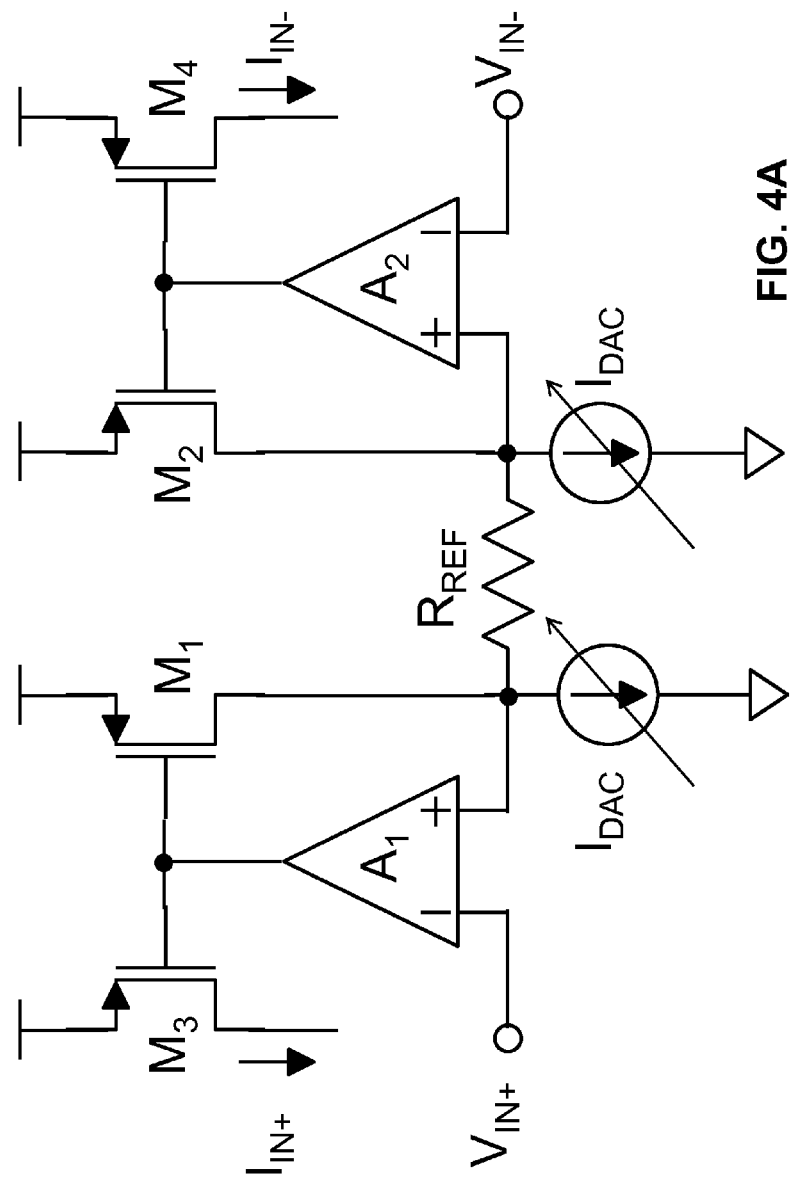
FIG. 4A is a simplified schematic diagram illustrating one example of a circuit topology for use in implementing a first portion of the embodiment illustrated in FIG. 3B.
Figure 5A:
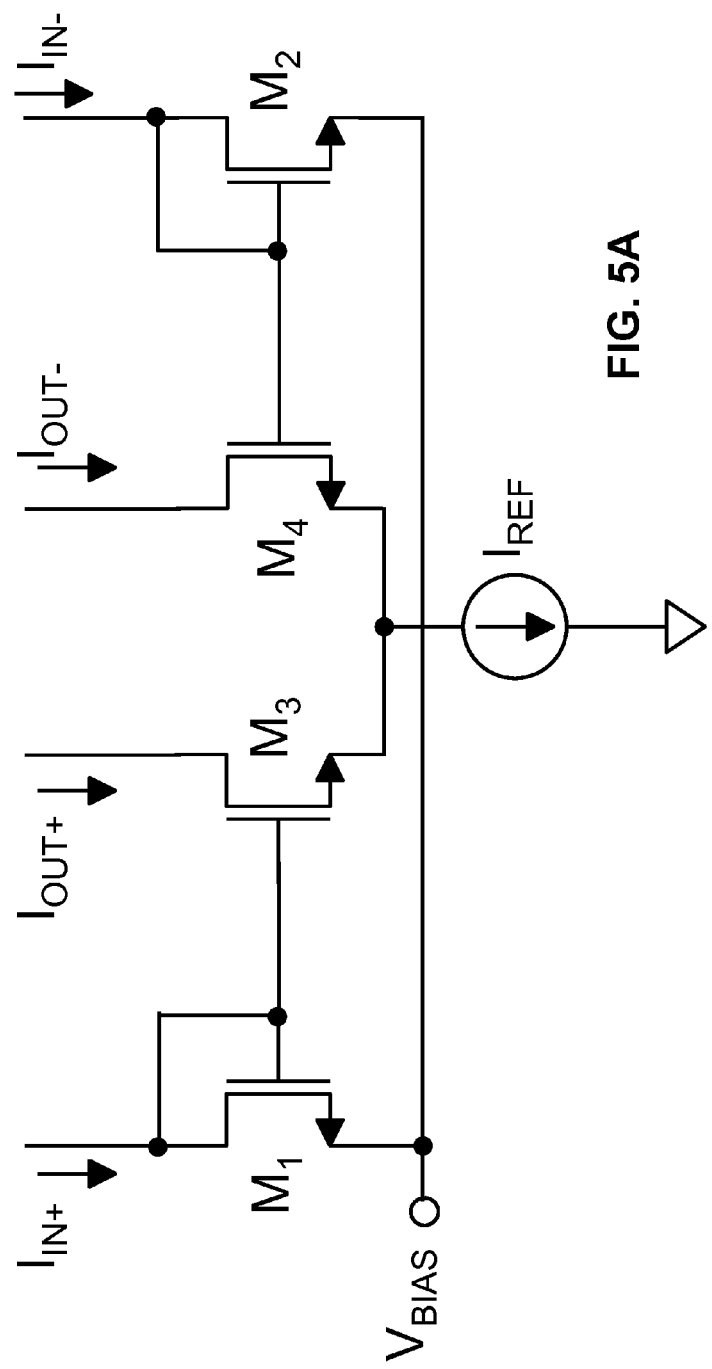
FIG. 5A is a simplified schematic diagram illustrating one example of a circuit topology for use in implementing a second portion of the embodiment illustrated in FIG. 3B.

Effective circuit topologies of the linearized transconductance and translinear current amplifier portions 100, 200 are extracted and shown for explanatory purposes in further simplified form in FIGS. 4A and 5A. Note that the circuit topology for the translinear current amplifier portion shown in FIG. 5A incorporates n-channel MOSFET devices rather than the p-channel MOSFET devices for $M_1$, $M_2$, $M_3$, $M_4$. So long as they are comparable in other respects (size, region of operation, and the like), the current amplifying effects of the translinear loop formed by the devices $M_1$, $M_2$, $M_3$, $M_4$ remain the same irrespective of their shared channel type.

With reference to FIG. 3A, the variable current gain $A_i$ of the translinear current amplifier portion 200 and transconductance $G_m$ of the linearized transconductance portion 100 may be determined generally according to eqs. (i)-(iii) below:

$$\frac{I_{IN+} + I_{IN-}}{V_{IN+} - V_{IN-}} = \frac{2}{R_{REF}} \quad (i)$$

$$A_i = \frac{I_{OUT+} - I_{OUT-}}{I_{IN+} - I_{IN-}} \quad (ii)$$

$$G_m = \frac{I_{OUT+} - I_{OUT-}}{V_{IN+} - V_{IN-}} = \frac{2A_i}{R_{REF}} \quad (iii)$$

With further reference to FIGS. 3B, 4A, and 5A, the current gain $A_i$ of the translinear current amplifier portion 100 may be defined according to eq. (1) below:

$$A_i = \frac{I_{OUT+} - I_{OUT-}}{I_{IN+} - I_{IN-}} = \frac{I_{OUT0}}{I_{IN0}}, \text{ where } I_{IN0} = I_{DAC}, I_{OUT0} = \frac{I_{REF}}{2} \quad (1)$$

The transconductance $G_m$ of LTA system 10 may then be determined according to eq. (2) below; and, the voltage gain of the PGA or other adjustable gain amplifier incorporating LTA system 10 (with reference to FIG. 2) may be determined according to eq. (3) below:

$$G_m = \frac{I_{REF}}{I_{DAC} \cdot R_{REF}} \quad (2)$$

$$A_v = \frac{I_{REF} \cdot R}{I_{DAC} \cdot R_{REF}} \quad (3)$$

As shown by eq. (3), the overall voltage amplifier gain value $A_v$ remains substantially constant across process, supply voltage, and temperature (PVT) variations because it is dependent on a ratio of parameters for similar components. Since the amplifier A feedback resistance R, such as illustrated in FIG. 2, and the reference resistance $R_{REF}$ of the LTA system 10 are of same type components, and since the input and output current source sections' currents $I_{DAC}$ and $I_{REF}$ are generated by the same circuitry, their values will track over PVT variations and mutually cancel.

It is apparent from eq. (3) that the voltage gain $A_v$ may be varied by adjusting either one or both of the source currents $I_{REF}$ and $I_{DAC}$. Preferably, voltage gain $A_v$ is controlled by varying the current $I_{DAC}$, since both $A_v$ and $G_m$ would then be inversely proportional in value to the selectively controlled current. In this way, the input linear range of the LTA system 10 may be automatically adjusted with the resulting gain of the PGA (or other adjustable gain amplifier).

By way of example, in an AGC loop employing a PGA, the gain of the PGA is modified to generate constant output voltage swing. Assuming a constant output voltage swing, large gains are obtained for small PGA input voltages. Conversely, small gains are obtained for large PGA input voltages. The input linear range of the LTA system 10 may be express according to eq. (4) below:

$$|V_{IN+} - V_{IN-}| < I_{DAC} \cdot R_{REF} \qquad (4)$$

For input voltage differentials beyond this value, the signal will be clipped because one of the MOSFET devices $M_1$ or $M_2$ will have zero current. The input linear range of LTA system 10 from eq. (4) also constitutes the denominator in the voltage gain $A_v$ value defined by eq. (3). Therefore, the output linear range of the resulting adjustable gain amplifier system, or the product of the voltage gain $A_v$ and the input linear range of LTA system 10, would remain constant at a value of $I_{REF} \cdot R$ (since the variable factor then cancels out). This would not be the case were the current $I_{REF}$ selectively varied instead. Preferably, the LTA system's input linear range is suitably scaled so that signal clipping due to current starving of either MOSFET device $M_1$ or $M_2$ may only occur at the same signal level as signal clipping due to output of the operational amplifier A in FIG. 2 reaching supply rail levels.

Figure 4B:
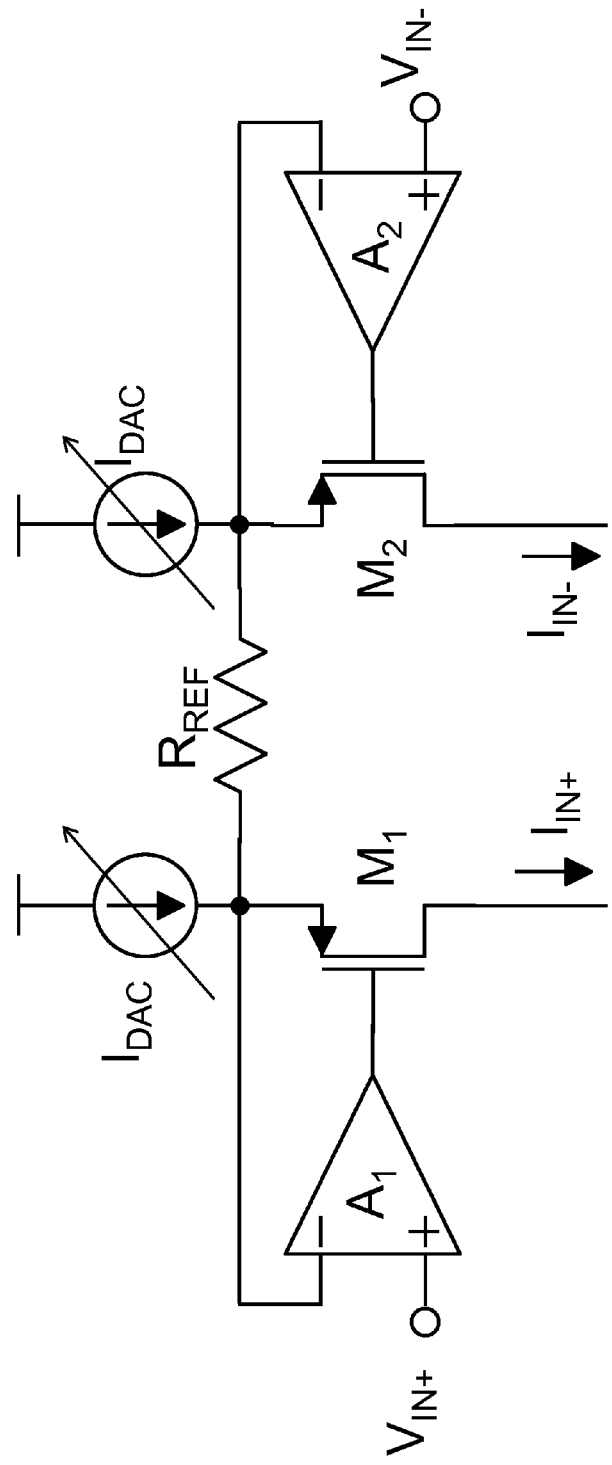
FIG. 4B is a simplified schematic diagram illustrating another example of a circuit topology for alternate use in implementing the first portion of the embodiment illustrated in FIG. 3B.
Figure 4C:
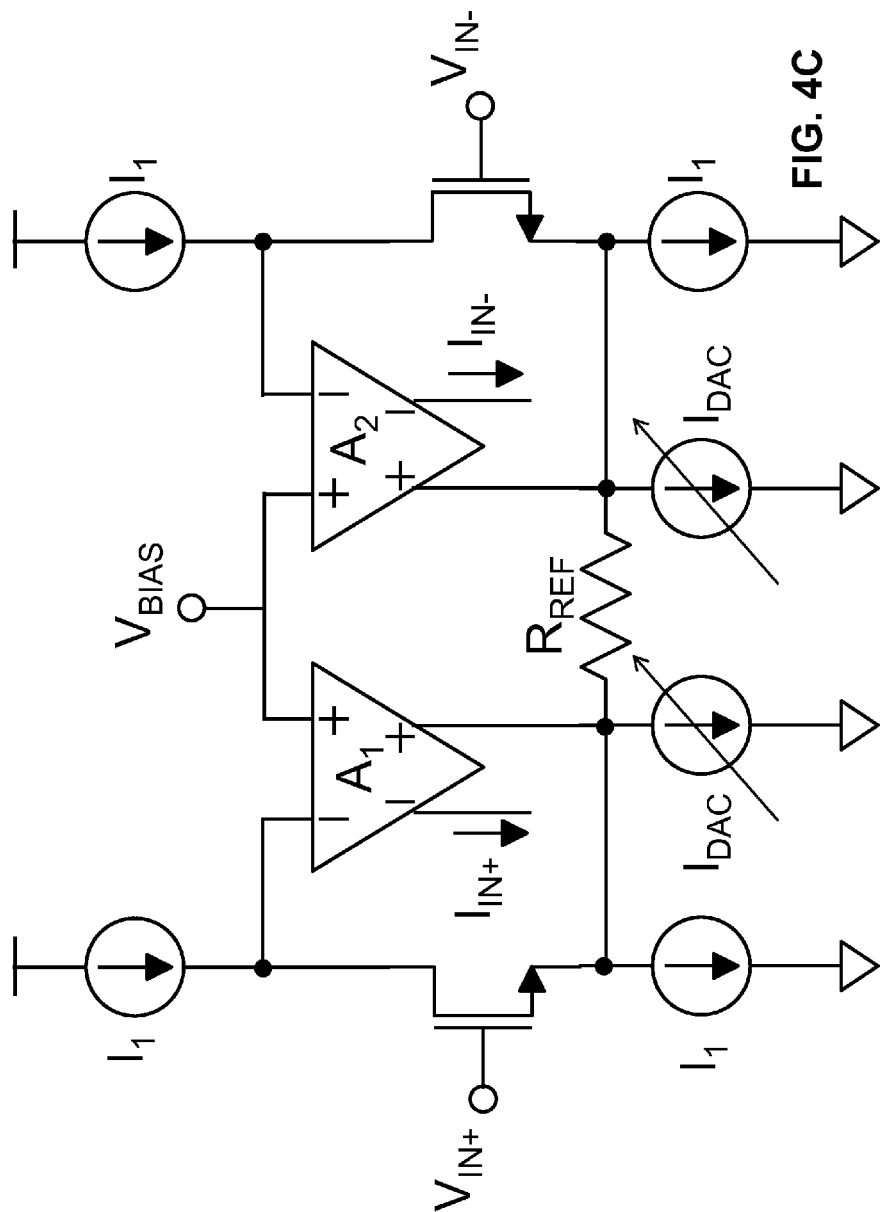
FIG. 4C is a simplified schematic diagram illustrating yet another example of a circuit topology for alternate use in implementing the first portion of the embodiment illustrated in FIG. 3B.

While the linearized transconductance portion 100 is preferably formed in the examplary embodiment disclosed using p-channel MOSFET type transistor devices $M_1$, $M_2$, $M_3$, $M_4$, portion 100 may otherwise be formed in alternate embodiments using transistor devices of other type, polarity, and number—depending on the particular requirements of the intended application. In those alternate embodiments, suitable accommodations would be made in circuit topology to ensure that substantially all the input voltage differential $V_{IN+}-V_{IN-}$ falls across reference resistance element 115. Examples of other circuit topologies which may be incorporated in the linearized transconductance portion of various alternate embodiments are illustrated in FIGS. 4B and 4C. Unlike the topology of FIG. 4A incorporated in portion 100 in the embodiment of FIG. 3B, the topologies of FIGS. 4B and 4C employ just a pair of MOSFET devices (p-channel in the topology of FIG. 4B, n-channel in the topology of FIG. 4C) to generate an intermediate current across resistance element $R_{REF}$.

In various other alternate embodiments, topologies exclusively incorporating bipolar junction transistor (BJT) devices rather than the NMOSFET devices shown in the illustrated topologies may be employed. For example, NPN BJT devices may be incorporated in place of the NMOSFET devices. Alternatively, PNP BJT devices may be incorporated in place of the PMOSFET devices. The translinear loop of the portion 200 would accordingly be formed of BJT devices in those embodiments.

Figure 5B:
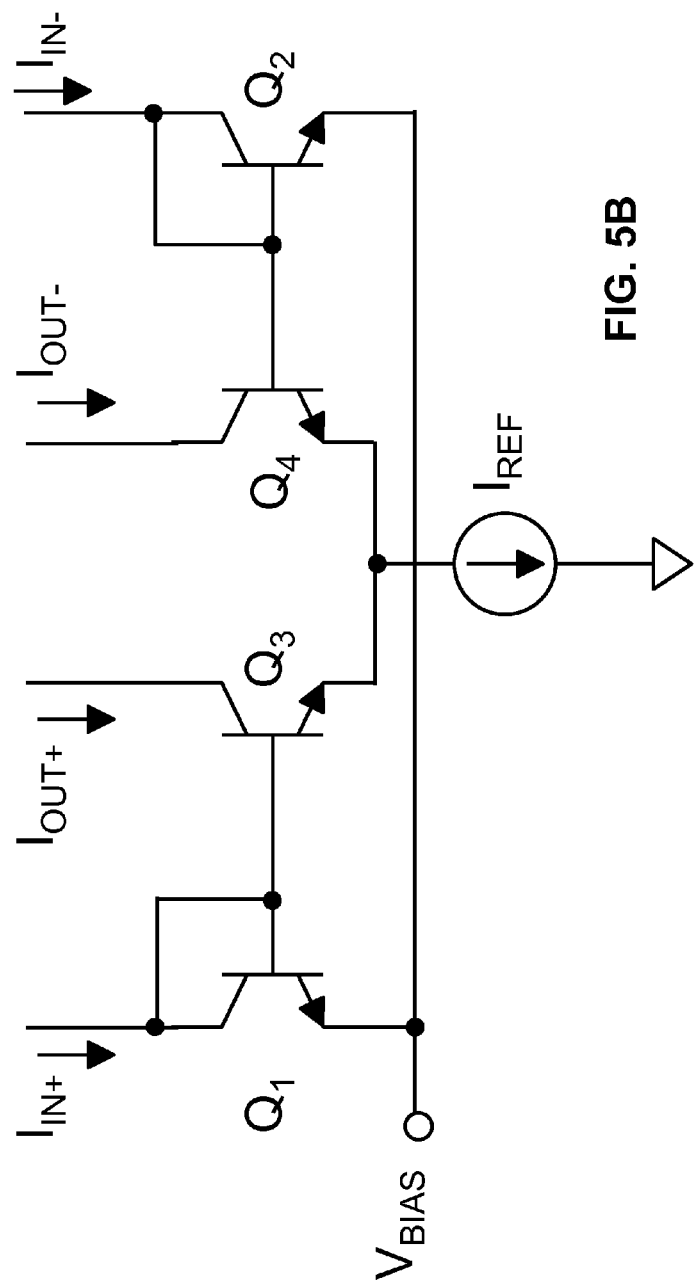
FIG. 5B is a simplified schematic diagram illustrating another example of a circuit topology for alternate use in implementing the second portion of the embodiment illustrated in FIG. 3B.

Similarly, the other portions and sections of the LTA system 10 may be formed in alternate embodiments by any other suitable means known in the art. For example, the translinear current amplifier portion 200 may be alternatively formed in cooperation with the linearized transconductance portion 100 (with which it shares components like the transistor devices $M_1$, $M_2$, $M_3$, $M_4$) using transistor devices of other type, polarity, and number so long as a suitable translinear loop is maintained to effect sufficient current controlled current amplification to satisfy the particular requirements of the intended application. As mentioned, for example, the translinear loop 230 of portion 200 may be defined in certain alternate embodiments by n-channel MOSFET devices operating in weak inversion, such as illustrated in FIG. 5A. In certain other alternate embodiments, the translinear loop 230 may be formed by BJT devices operating in their forward active regions, as illustrated in FIG. 5B, so that each BJT's collector current depends exponentially on its base-to-emitter voltage. These topologies employing n-channel MOSFET and NPN BJT devices, such as illustrated in FIGS. 5A-5B, are readily compatible with the topology examples for the linearized transconductance portion illustrated in FIGS. 4A-4C.

Figure 6:
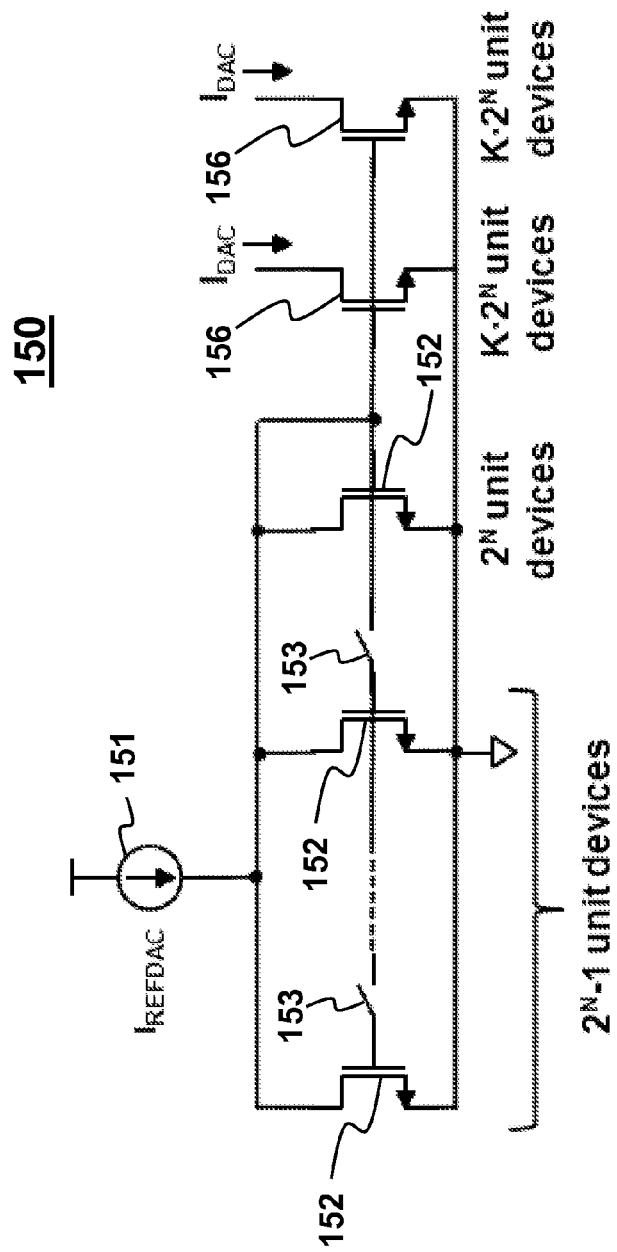
FIG. 6 is a simplified schematic diagram illustrating one example of a variable current section implementation incorporated in the embodiment illustrated in FIG. 3B.

FIG. 6 schematically illustrates one example of a variably configured input current source section 150 shown in FIG. 3B. In this exemplary embodiment, the input current source section 150 is implemented in a digital-to-analog (DAC) circuit arrangement which selectively generates current $I_{DAC}$ with reference to a fixed current $I_{REFDAC}$ and in response to an N-bit digital input gain control signal $d_{in}$. Preferably, the section 150 includes a fixed current source 151 formed by any suitable means known in the art, which provides the fixed current $I_{REFDAC}$. Coupled to current source 151 is a bank of conductive unit devices 152 which may be selectively interconnected by a plurality of switches 153. A plurality of conductive output unit devices 156 are coupled to the unit devices 152 as shown, to establish the output conduction paths for the generated current $I_{DAC}$. The switches 153 are preferably set according to the input digital code $d_{in}$, such that they variably enable a corresponding number of unit devices 152, to control the current $I_{DAC}$ established through the output conductive unit devices 156. The current $I_{DAC}$ is defined according to eq. (5) below, which then yields a composite definition for voltage gain $A_v$ expressed in eq. (6) (for a PGA such as shown in FIG. 2).

$$I_{DAC} = K \cdot \frac{2^N}{2^N + d_{in}} \cdot I_{REFDAC} \qquad (5)$$

$$A_v = \frac{2^N + d_{in}}{K \cdot 2^N} \cdot \frac{I_{REF} \cdot R}{I_{REFDAC} \cdot R_{REF}} \qquad (6)$$

Turning to the linearizing amplifiers 140a, 140b, they may implemented by any suitable means known in the art, depending on the particular requirements of the intended application. Circuit simplicity, low voltage operation, power consumption, noise, and stability are among the more important factors which are weighed in selecting one choice of architecture over another for these amplifiers 140a, 140b. A simple topology which may be employed for each amplifier 140a, 140b, for example, is a common-source stage topology, with the inputs corresponding respectively to the gate and source terminals of a field effect transistor device, while the output corresponds to the drain terminal. An amplifier with this topology, however, would not optimize minimum supply voltage operation. Nor would it exhibit sufficient stability in very many applications.

Figure 7:
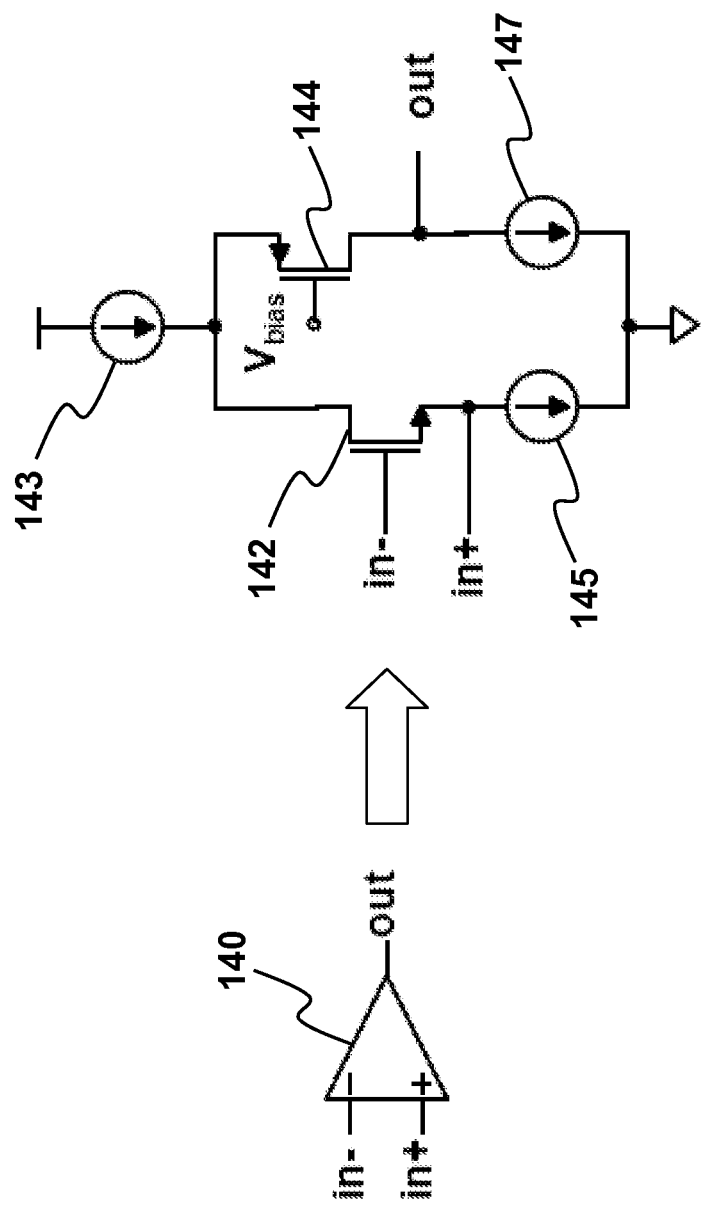
FIG. 7 is a simplified schematic diagram illustrating one example of a linearizing amplifier implementation incorporated in the embodiment illustrated in FIG. 3B; and, FIG. 8 is a simplified schematic diagram illustrating the embodiment of FIG. 3B, with exemplary implementations for certain portions thereof shown in more detail.

Accordingly, each of the linearizing amplifiers 140a, 140b is preferably implemented as a folded cascode stage, such as schematically illustrated in FIG. 7. This topology includes input and output MOSFET devices 142, 144 interconnected between current sources 143 and 145, 147 as shown. The input MOSFET device 142 is configured with its gate and source terminals defining the receiving points of an incoming signal's complementary components. The output MOSFET device 144 is of opposite channel polarity (to input device 142), and is configured with its drain terminal defining the linearizing amplifier output.

Figure 8:
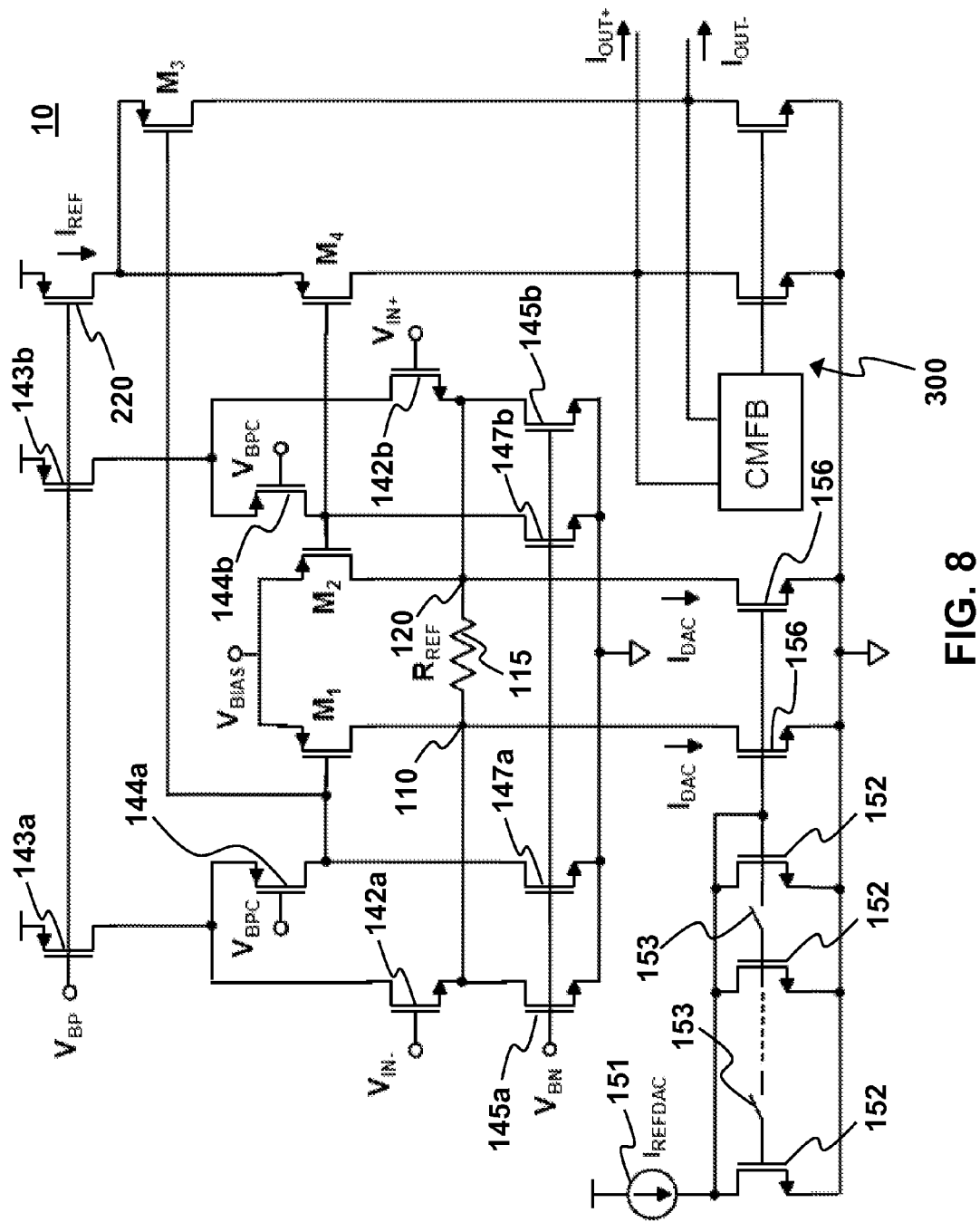

FIG. 8 illustrates the LTA system 10 of FIG. 3B, with its input current source section 150 and linearizing amplifiers 140a, 140b shown in more detail, implemented as illustrated in FIGS. 6-7. The current source 143 in each amplifier 140a, 140b is also shown in more detail, preferably implemented in this example by a p-channel MOSFET device 143a, 143b with its gate terminal coupled to a p-channel bias voltage source $V_{BP}$. Similarly, the current sources 145, 147 in each amplifier 140a, 140b is shown in more detail, preferably implemented by n-channel MOSFET devices 145a, 147a and 145b, 147b with their gate terminals coupled to an n-channel bias voltage source $V_{BN}$. The output current source section 220 is also shown in more detail in FIG. 8, preferably implemented in this example by a p-channel MOSFET device 220 with its gate terminal coupled (along with the gate terminals of the devices 143a, 143b) to the p-channel bias voltage source $V_{BP}$.

One can verify with this simplified circuit of the resulting LTA system 10 that on any path from the supply rail to ground, the minimum supply voltage $AVDD_{min}$ required to ensure operation of all MOSFET devices in their saturation regions is defined by eq. (7) below:

$$AVDD_{min} = V_{GS} + 2 \cdot V_{DS,sat} = V_T + 3 \cdot V_{DS,sat} \qquad (7)$$

For many known complementary metal oxide semiconductor (CMOS) processes, the device threshold voltage $V_T$ typically ranges on the order of (300-400) mV, while operation of a MOSFET device in its weak inversion region is typically attained at drain-to-source voltages of several tens of mV. Sub-1V supply voltages may be used successfully to operate a circuit employing such devices to process input voltage swings on the order of several hundreds of mV.

Although this invention has been described in connection with specific forms and embodiments thereof, it will be appreciated that various modifications other than those discussed above may be resorted to without departing from the spirit or scope of the invention as defined in the appended claims. For example, the device types, channel polarities, sizes, operating or characteristic voltages and currents, fabrication technologies, and the like specifically shown or described may be suitably varied or replaced as necessary for the particular requirements of various applications. Moreover, functionally equivalent elements or processes may be substituted for those specifically shown and described, certain features may be used independently of other features, and in certain cases, particular locations of the elements or processes may be reversed or interposed, all without departing from the spirit or scope of the invention as defined in the appended claims.

What is claimed is:

1. An adjustable gain amplifier system having cleanly adjustable and stable linearized gain for amplifying an input signal in amplitude comprising:
    a main amplifier; and,
    a linearized transconductance amplifier coupled to said main amplifier, said linearized transconductance amplifier generating an amplified current signal in response to the input signal according to a transconductance factor variably defined therefor, said linearized transconductance amplifier including:
        a linearized transconductance portion generating an intermediate current signal based upon a voltage of the input signal, said linearized transconductance portion forming an unswitched resistor-based conduction path through a reference resistance for said intermediate current signal; and,
        a translinear current amplifier portion coupled to said linearized transconductance portion, said translinear current amplifier portion forming a translinear loop section for amplifying said intermediate current signal to generate said amplified current signal, said translinear current amplifier portion being selectively reconfigurable to correspondingly adjust said transconductance factor;
    wherein the linearized gain is adjustably defined according to said adjusted transconductance factor.

2. The system as recited in claim 1, wherein said linearized transconductance portion includes an input current source section coupled to said reference resistance, and said translinear current amplifier portion includes an output current source section coupled to said translinear loop section; at least one of said input and output current source sections being selectively variable in current source value.

3. The system as recited in claim 2, wherein said input current source section is selectively variable in current source value responsive to an input gain control signal and said output current source section is fixed in current source value, wherein said transconductance factor is variable in inversely proportional relation to said input current source value, and a constant output linear range is maintained for said adjustable gain amplifier system.

4. The system as recited in claim 3, wherein said unswitched resistor-based conduction path is established in said linearized transconductance portion said through a reference resistance, said transconductance factor being inversely proportional in value to said reference resistance.

5. The system as recited in claim 3, wherein said input current source section includes a digital to analog conversion (DAC) circuit selectively setting said input current source value responsive to said input gain control signal.

6. The system as recited in claim 5, wherein said DAC circuit is driven with reference to said fixed current source value maintained by said output current source section.

7. The system as recited in claim 2, wherein said linearized transconductance and translinear current amplifier portions of said linearized transconductance amplifier are formed in synergistically integrated manner, wherein said linearized transconductance portion includes a plurality of transistor devices collectively defining at least a portion of said translinear loop section of said translinear current amplifier portion.

8. The system as recited in claim 7, wherein said linearized transconductance portion includes:
    a reference resistance disposed between first and second nodes;

first and second transistor devices respectively defining conduction paths from said first and second nodes to a bias voltage source, said unswitched resistor-based conduction path being thereby established through said first and second transistor devices and reference resistance; and, third and fourth transistor devices having control terminals respectively coupled to control terminals said first and second transistor devices.

9. The system as recited in claim 8, wherein said translinear current amplifier portion includes:
said translinear loop section collectively defined by said first, second, third, and fourth transistor devices of said linearized transconductance portion; and,
said output current source section coupled to conduction paths of said third and fourth transistor devices.

10. The system as recited in claim 9, wherein said amplified current signal is a differential signal, and said linearized transconductance amplifier further includes a common mode feedback amplifier (CMFB) coupled to said conduction paths of said third and fourth transistor devices defining an output common mode voltage corresponding to said amplified current signal.

11. The system as recited in claim 9, wherein each of said first, second, third, and fourth transistor devices each include a metal-oxide-semiconductor field effect transistor (MOSFET).

12. The system as recited in claim 2, wherein said linearized transconductance portion further includes:
a reference resistance is disposed between first and second nodes;
first and second transistor devices respectively defining conduction paths from said first and second nodes to a bias voltage source, said unswitched resistor-based conduction path being thereby established through said first and second transistor devices and reference resistance; and,
first and second linearizing amplifier sections respectively coupled to controlling terminals of said first and second transistor devices, each of said first and second linearizing amplifier sections having one input terminal coupled to receive a component of the input signal and another terminal coupled to one of said first and second nodes.

13. A programmable gain amplifier system having switching noise free gain adjustment and stable linearized gain for amplifying an input signal in amplitude comprising:
a main amplifier; and,
a linearized transconductance amplifier coupled to said main amplifier, said linearized transconductance amplifier generating an amplified current signal in response to the input signal according to a transconductance factor variably defined therefor, said linearized transconductance amplifier including:
a linearized transconductance portion generating an intermediate current signal based upon a voltage of the input signal, said linearized transconductance portion including a reference resistance and forming an unswitched resistor-based conduction path for the intermediate current signal therethrough;
a translinear current amplifier portion coupled to said linearized transconductance portion, said translinear current amplifier portion being selectively reconfigurable to correspondingly adjust said transconductance factor and including a translinear loop section for amplifying said intermediate current signal to generate the amplified current signal; and,
a variable current source section coupled to at least one of said linearized transconductance and translinear current amplifier portions, said variable current source section being selectively variable in current source value responsive to an input gain control signal;
wherein the linearized gain is adjusted according to said adjusted transconductance factor to maintain a constant output linear range for said adjustable gain amplifier system, and said transconductance factor remains inversely proportional in value to said current source and reference resistance values.

14. The system as recited in claim 13, wherein said linearized transconductance portion includes an input current source section coupled to opposing terminals of reference resistance, and said translinear current amplifier portion includes an output current source section coupled to said translinear loop section; said output current source section being fixed in current source value, said input current source section being selectively variable in current source value responsive to the input gain control signal.

15. The system as recited in claim 14, wherein said reference resistance is disposed between first and second nodes, said linearized transconductance portion further including:
first and second transistor devices respectively defining conduction paths from said first and second nodes to a bias voltage source, said unswitched resistor-based conduction path being thereby established through said first and second transistor devices and reference resistance; and,
first and second linearizing amplifier sections respectively coupled to controlling terminals of said first and second transistor devices, each of said first and second linearizing amplifier sections having one input terminal coupled to receive a component of the input signal and another terminal coupled to one of said first and second nodes.

16. The system as recited in claim 15, wherein said linearized transconductance and translinear current amplifier portions of said linearized transconductance amplifier are formed in synergistically integrated manner, wherein said linearized transconductance portion includes a plurality of transistor devices collectively defining at least a portion of said translinear loop section of said translinear current amplifier portion.

17. The system as recited in claim 16, wherein said linearized transconductance portion further includes third and fourth transistor devices having control terminals respectively coupled to control terminals said first and second transistor devices; and, said translinear loop section of said translinear current amplifier portion is collectively defined by said first, second, third, and fourth transistor devices of said linearized transconductance portion.

18. The system as recited in claim 17, wherein said input current source section is coupled to conduction paths of said first and second transistor devices; and, said output current source section coupled to conduction paths of said third and fourth transistor devices.

19. The system as recited in claim 18, wherein each of said first, second, third, and fourth transistor devices each include a metal-oxide-semiconductor field effect transistor (MOSFET).

20. The system as recited in claim 19, wherein said input current source section includes a digital to analog conversion (DAC) circuit selectively setting said input current source value responsive to said input gain control signal.

21. A linearized transconductance amplifier system for establishing cleanly adjustable and stable linearized gain in an adjustable gain voltage amplifier comprising:

a linearized transconductance portion generating an intermediate current signal based upon a voltage of an input signal, said linearized transconductance portion including at least first and second transistor devices, a reference resistance forming an unswitched resistor-based conduction path for said intermediate current signal therethrough, and an input current source section coupled to said reference resistance and selectively variable in current source value responsive to an input gain control signal; and, a translinear current amplifier portion coupled to said linearized transconductance portion, said translinear current amplifier portion being selectively reconfigurable to variably establish a transconductance factor with said linearized transconductance portion, and including:

a translinear loop section for amplifying said intermediate current signal to generate said amplified current signal; and, an output current source section coupled to said translinear loop section, said output current source section being fixed in current source value;

wherein said linearized transconductance and translinear current amplifier portions adjustably define said transconductance factor for adjustably controlling the linearized gain and maintaining a constant output linear range for the adjustable gain voltage amplifier, said transconductance factor remaining inversely proportional in value to said input current source and reference resistance values.

22. The system as recited in claim 21, wherein said linearized transconductance and translinear current amplifier portions of said linearized transconductance amplifier are formed in synergistically integrated manner, wherein said first and second transistor devices of said linearized transconductance portion form at least a part of said translinear loop section of said translinear current amplifier portion.

23. The system as recited in claim 22, wherein said first and second transistor devices of said linearized transconductance portion respectively define conduction paths from opposing terminals of said reference resistance to a bias voltage source, said unswitched resistor-based conduction path being thereby established through said conduction paths of said first and second transistor devices and reference resistance.

24. The system as recited in claim 23, wherein said linearized transconductance portion further includes:

third and fourth transistor devices having control terminals respectively coupled to control terminals said first and second transistor devices; and, first and second linearizing amplifier sections respectively coupled to controlling terminals of said first and second transistor devices, each of said first and second linearizing amplifier sections having one input terminal coupled to receive a component of the input signal and another terminal coupled to one of said opposing terminals of said reference resistance.

25. The system as recited in claim 24, wherein said translinear current amplifier portion includes:

said translinear loop section collectively defined by said first, second, third, and fourth transistor devices of said linearized transconductance portion; and, said output current source section coupled to conduction paths of said third and fourth transistor devices.

26. The system as recited in claim 25, wherein each of said first, second, third, and fourth transistor devices each include a metal-oxide-semiconductor field effect transistor (MOSFET).

27. The system as recited in claim 26, wherein said input current source section includes a digital to analog conversion (DAC) circuit selectively setting said input current source value responsive to said input gain control signal; and, said DAC circuit is driven with reference to said fixed current source value maintained by said output current source section.

28. The system as recited in claim 27, wherein said amplified current signal is a differential signal, and said linearized transconductance amplifier further includes a common mode feedback amplifier (CMFB) coupled to said conduction paths of said third and fourth transistor devices defining an output common mode voltage corresponding to the amplified current signal.

\* \* \* \* \*